United States Patent [19]

Ouyang et al.

[11] Patent Number: 4,704,587
[45] Date of Patent: Nov. 3, 1987

[54] CRYSTAL OSCILLATOR CIRCUIT FOR FAST RELIABLE START-UP

[75] Inventors: Kenneth W. Ouyang, Huntington Beach; Karl M. J. Lofgren, Long Beach; Gerald W. Shearer, Orange, all of Calif.

[73] Assignee: Western Digital Corporation, Irvine, Calif.

[21] Appl. No.: 937,984

[22] Filed: Dec. 4, 1986

[51] Int. Cl.⁴ .............................................. H03B 5/36
[52] U.S. Cl. ............................. 331/116 FE; 331/158
[58] Field of Search ............. 331/116 FE, 116 R, 158; 368/159

[56] References Cited

U.S. PATENT DOCUMENTS 4,307,354 12/1981 Miyagawa et al. .......... 331/116 FE

Primary Examiner—Siegfried H. Grimm
Attorney, Agent, or Firm—Spensley Horn Jubas & Lubitz

[57] ABSTRACT

The present invention provides a circuit which facilitates fast and reliable start-up of an oscillator crystal without the amplification of undesirable frequencies of noise. A crystal is provided which is connected in parallel to an amplifying inverter having an input and an output. Grounded capacitors are connected respectively to the input and output of the inverter for stability. A first high resistance feedback path and a second low resistance feedback path are provided between the output of the inverter and the input of the inverter. A switch is also provided for selectively engaging or disengaging the low resistance feedback path with the inverter at preselected points in time. During operation of the circuit in the preferred manner, the switch engages the low resistance feedback path with the inverter to allow maximum charge build-up at the stabilizing capacitors upon turn-on of a supply voltage, thus quickly generating a large input voltage at the inverter. The voltage at the input of the inverter quickly becomes equal to the voltage at the output of the inverter, resulting in high gain. Thereafter, the switch disengages the low resistance path from the inverter, creating a voltage transition. The voltage transition results in high level noise which may quickly be amplified by the high gain inverter to generate maximum amplitude at the crystal. The high resistance path keeps the inverter biased at high gain, while the opening of the low resistance path minimizes noise during subsequent oscillator operation.

8 Claims, 8 Drawing Figures

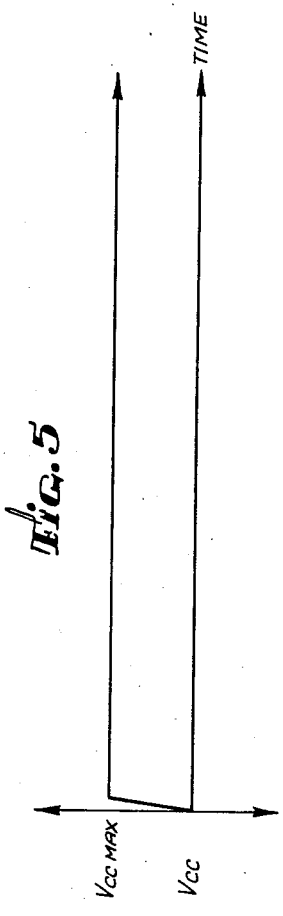
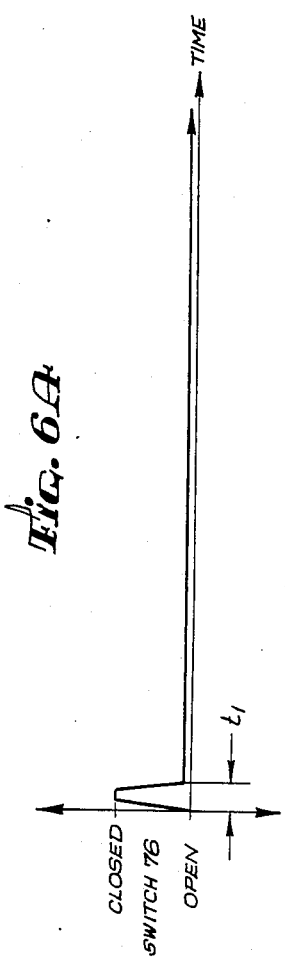
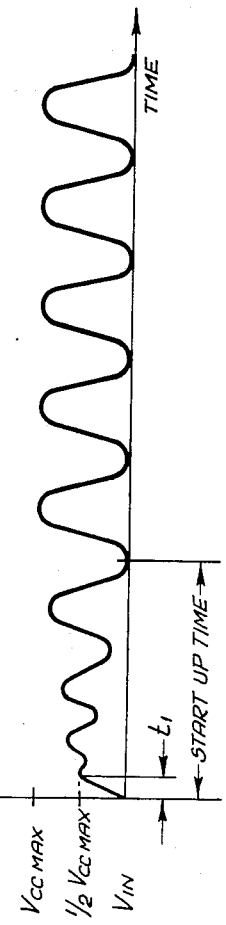
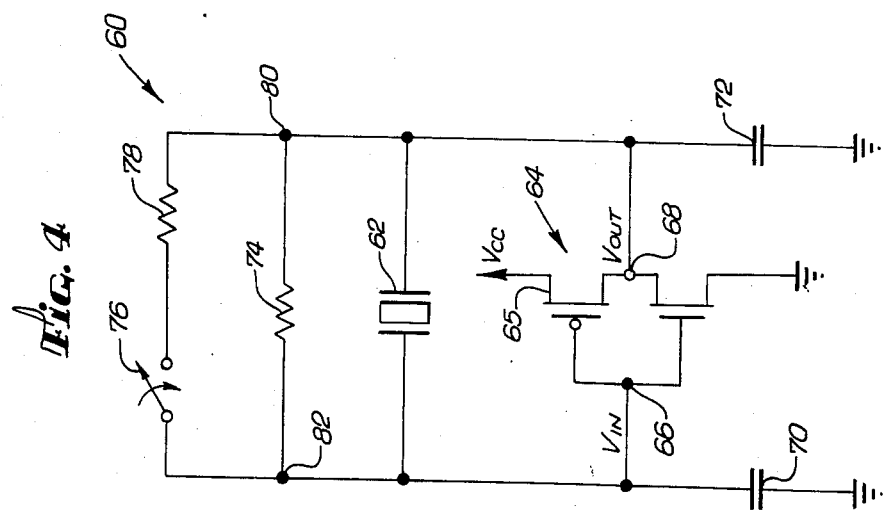

CRYSTAL OSCILLATOR CIRCUIT FOR FAST RELIABLE START-UP

BACKGROUND OF THE INVENTION

1. Field of the Invention

This invention relates generally to crystal oscillators, and more specifically to an improved circuit for reliably assuring that a crystal oscillator will commence oscillating and for decreasing the time required for the crystal oscillator to reach its maximum oscillation amplitude.

2. Description of the Prior Art

Crystal oscillators have long been utilized in devices which require accurate and/or precise clocks, such as microprocessors or the like. A common problem associated with known crystal oscillators, however, has been their failure to commence oscillating at all or within an acceptably short time period. In addition, a large period of time is required for known oscillators to attain their maximum oscillation amplitude once the circuit power supply is turned on, necessitating a large period of time for start-up of the devices in which they are utilized.

In MOS technology, crystal oscillators are typically formed in a circuit such as that illustrated in FIG. 1. A crystal element 30 is provided which is connected in parallel to a high gain CMOS inverter 32 formed by a P-channel transistor 42 and an N-channel transistor 44. Stabilizing capacitors 34 and 36 are provided which are connected to ground and respectively to the input 38 and the output 40 of the inverter 32. In operation, when the circuit supply voltage $V_{cc}$ is turned on, the transistor 42 will be on, generating a voltage $V_{out}$ at the inverter output 40. Volta $V_{out}$ then charges up the capacitor 36 and develops a voltage at the crystal 30, causing it to begin oscillating at a low amplitude. This generates a voltage $V_{in}$ at the input 38 of the inverter and charges capacitor 34. The increasing voltage $V_{in}$ slowly causes the inverter to move to its high gain region, thereby allowing the amplitude of the oscillations of the crystal to increase. Repeated feedback in this manner establishes a voltage over time at the crystal 30 as illustrated in FIG. 2.

Whether crystal 30 will commence oscillation depends on several factors, including the rise time and the shape of the power supply waveform. In addition, the absence of noise can result in start-up failure. In most circuits, noise is undesirable. In the circuit of FIG. 1, however, noise at the input to the inverter actually aids in achieving start-up.

If crystal 30 commences oscillation, several factors affect the time required for the oscillator to attain maximum amplitude oscillations. These factors include, but are not limited to, the gain of the inverter 32 and the noise level passing through the inverter 32. A high gain inverter will amplify existing noise more to achieve maximum amplitude variation at the output faster than will a low gain inverter. In addition, a high level of noise will require less amplification to achieve the necessary amplitude variation to support oscillation than will a lesser level of noise.

The known inverter 32 has a voltage characteristic as illustrated by line 45 of FIG. 3. The slope of this curve, $d\,V_{out}/d\,V_{in}$, is the voltage gain of the inverter. The desirable goal of attaining maximum gain (and thus minimum start-up time for the oscillator) is obtainable at the inverter when $V_{out}$ is equal to $V_{in}$, and may be derived from the circuit by placing a resistor element 46 in parallel with the inverter 32 to aid in the charging of the capacitor 34. Line 48 plotted on the voltage characteristic of FIG. 3 represents the relationshi $V_{in}=V_{out}$ which results when resistor element 46 is connected in parallel to the inverter 32. The resistor element 46 biases the inverter to operate at the maximum gain point 50 of curve 45, thereby reducing the time required by the oscillator circuit to reach maximum voltage amplitude.

The start-up time of the circuit may be minimized by charging the capacitor 34 as quickly as possible to place the inverter in its high gain region. This may be accomplished by choosing the value of resistance of the resistor element 46 to be as small as possible, thus allowing the voltage $V_{out}$ to charge up the capacitor 34 quickly.

A major constraint has existed in the past, however, on the minimum value of resistance which may be chosen for the resistor element 46. Oscillating crystals characteristically pass signals only of select frequencies and prevent passage of all other frequencies. The designer must thus attempt to eliminate all non-select frequencies from the circuit such that they do not degrade the strength of the signal of the select frequency. When the resistor element 46 is added to the circuit to achieve high gain, however, an additional feedback path 52 is created between the input 38 and the output 40 of the inverter 32 which bypasses the crystal 30. Noise of undesirable frequencies present at the output 40 of the inverter 32 may thus travel through this additional feedback path 52 to the input 38 of the inverter 32 and be amplified, therby degrading the overall performance of the oscillator. Designers have thus in the past selected the resistor element 46 with a relatively high value of resistance in order to prevent most frequencies of noise from traveling through the feedback path 52, thereby avoiding degradation of the performance of the oscillator.

Designers have thus previously had to balance the desire for noise-free operation during oscillation by providing a high value of resistance for resistor element 46 with the desire for a fast start-up time by providing a resistor element having a small value of resistance. Typically, the desire to achieve noise-free oscillation has been dominant, resulting in less than desirable start-up times for oscillator circuits in the past.

Known crystal oscillator circuits have thus not only failed to commence oscillation in the past, but in addition have contained constraints upon the speed at which maximum oscillation amplitude could be obtained if oscillation could be commenced.

SUMMARY OF THE INVENTION

The present invention is designed to allow fast, reliable start-up of a crystal oscillator circuit without the accompanying disadvantage of undesirable noise after start-up has been achieved. The present invention accomplishes this objective by providing a crystal connected in parallel to an amplifying inverter containing an input and an output. Grounded capacitors are connected respectively to the input and output of the inverter for stability during start-up. A first feedback path of high resistance is provided between the output and input of the inverter. A second feedback path of low resistance is also provided between the output and input of the inverter. Switch means are provided for selectively connecting the low resistance path with the inverter.

During operation of the circuit, the switch means is closed to allow the input capacitor to quickly charge up to the voltage of the output capacitor so as to cause the inverter to operate in its high gain region. After maximum gain is attained at the inverter, the switch means opens to disengage the low resistance path from the inverter, thereby creating a voltage jump across the inverter. The voltage jump results in high level noise which is greatly amplified by the inverter to aid in the initiation of oscillation. Moreover, disconnecting the low resistance path from the inverter results in the avoidance of undesirable noise during normal oscillation.

It is an advantage of the present invention that a crystal oscillator circuit is provided which will reliably commence oscillation during start-up.

It is a further advantage of the present invention that a crystal oscillator is provided which will reliably commence oscillation during start-up independent of the rise time or shape of the power supply waveform or the noise environmment of the circuit in which it is utilized.

It is a further advantage of the present invention that a crystal oscillator circuit is provided having a fast start-up time.

It is of further advantage of the present invention that a crystal oscillator circuit is provided having a fast start-up time while providing low noise operation after start-up.

These and other advantages of the present invention will be more readily understood by reference to the description of the preferred embodiment set forth below in conjunction with the accompanying drawings.

BRIEF DESCRIPTION OF THE DRAWINGS

FIG. 4 is a schematic diagram of the circuit of the present invention.

FIG. 5 is a plot of the voltage over time of the supply voltage of the circuit of the present invention.

FIG. 6A is a plot of the voltage over time across a switch which forms part of the circuit of the present invention.

FIG. 6B is a plot of the voltage over time of the crystal oscillator of the present invention during start-up.

DETAILED DESCRIPTION OF THE PREFERRED EMBODIMENT

Figure 2:
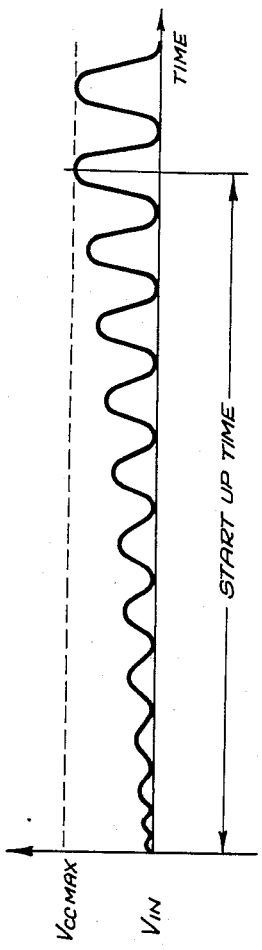
FIG. 2 is a plot of the voltage over time of the prior art crystal oscillator of FIG. 1 during start-up.
Figure 3:
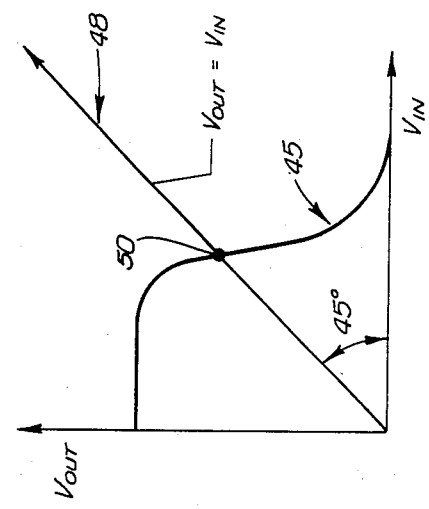
FIG. 3 is a schematic diagram of the voltage characteristic of the inverter of FIG. 1.

FIG. 4 illustrates the basic circuit arrangement of the crystal oscillator 60 of of the present invention. The circuit contains a crystal element 62, a CMOS inverter 64 connected in parallel to the crystal element 62 and having an input 66 and an output 68, a first stabilizing capacitor 70 connected to the input 66 of inverter 64, and a second stabilizing grounded capacitor 72 connected to the output 68 of the inverter 64. A relatively high value resistor element 74 is also provided which is connected in parallel to the inverter 64 to form a high resistance path between the output 68 and the input 66. In addition, a relatively low resistance resistor element 78 is provided which is connected in parallel to the inverter 64 via a switch 76 to form a low resistance path between the output 68 and the input 66.

The crystal oscillator circuit 60 of the present invention is designed to operate in the following manner. Initially, the switch 76 is closed, electrically connecting low resistance resistor element 78 with both the input 66 and the output 68 of the inverter 64. When in this position, a low resistance path is available across which voltage $V_{out}$ may pass from the output 68 of the inverter to the capacitor 70 to provide quick charging upon application of power to the circuit, i.e., upon turning on of supply voltage $V_{cc}$. When the voltage $V_{cc}$ is turned on, a P-channel transitor 65 of the inverter 64 will be on, and the voltage at output 68 of the inverter will track $V_{cc}$. Since the capacitor 70 charges quickly, voltage $V_{in}$ at the input 66 of the inverter 64 rises quickly to a level where it is approximately equal to voltage $V_{out}$ at the output 68 of the inverter 64, i.e., to the point of maximum gain of the inverter 64. The time required to achieve maximum gain at the inverter is therefore shortened when compared to the time which would have been required had only the high resistance path been available between the input 66 and the output 68 of the inverter 64.

Once a point in time is reached at which $V_{out}$ is approximately equal to $V_{in}$ and maximum gain is achieved by the inverter, the switch 76 is switched open, creating two desirable effects. First, the sudden opening of the switch 76 creates a voltage transition between the node 80 and the node 82 of the circuit. This voltage transition results in the desirable generation of high level noise at the input of the inverter 64. This noise is amplified by the inverter, which is operating with maximum gain. This serves to quickly increase the amplitude of oscillations in the crystal element 62. Quick start-up is therefore achieved by causing the inverter to be quickly biased to its high gain point and by generating noise at the input of the inverter.

The second desirable effect created upon opening of the switch 76 is the elimination of the low resistance path between the input 66 and the output 68 of the inverter through the low resistance resistor element 78. This prevents noise from degrading the performance of the oscillator after start-up has been achieved. However, the provision of the high resistance path between the output and the input of the inverter continues to bias the inverter to cause it to operate at high gain.

FIG. 5 illustrates a plot over time of the voltage $V_{cc}$ of the power supply of the circuit. The voltage reaches a maximum value $V_{cc}$ fairly quickly upon initiation and maintains this value over time.

FIG. 6A illustrates the state over time of the switch 76 utilized within the circuit of the present invention. The switch 76 is controlled to remain in a closed position for a predetermined time $t_1$ after which it automatically opens. The switch 76 may, for example, be an FET switch driven by the supply voltage $V_{cc}$, thus enabling the switch 76 to be activated almost immediately upon turn-on of the supply voltage.

FIG. 6B illustrates the characteristic over time of the voltage $V_{out}$ at the output 68 of the inverter 64. During time $t_1$, the switch 76 remains closed, quick charge-up of the capacitor 70 occurs, and $V_{in}$ increases to approximately $V_{out}$. As a result, a point is reached very quickly at which the inverter 64 provides high gain. After the predetermined time $t_1$ elapses, the switch 76 is automatically opened, creating a noise spike at the input to the inverter. As a result of the noise, the inverter output quickly drops, enabling the oscillator to increase its amplitude. The opening of the switch 76 also eliminates the low resistance path between the input and output of the inverter 64, requiring the output voltage $V_{out}$ of the inverter 64 to be passed either through the crystal 62 or through the high resistance resistor element 74. Along either path, however, only the desirable select frequencies are passed. As a result, maximum amplification and oscillation of the crystal are accomplished quickly, and undesirable noise during normal oscillation is simultaneously avoided. Moreover, start-up of the crystal oscillation is reliably assured. High level random noise need not be initially present in the circuit in order for start-up to occur since high level noise is generated by the circuit itself upon opening of the switch. Commencement of oscillation of the crystal is also independent of the rise time and shape of the power supply waveform since oscillation does not commence until high value gain is achieved.

Figure 1:
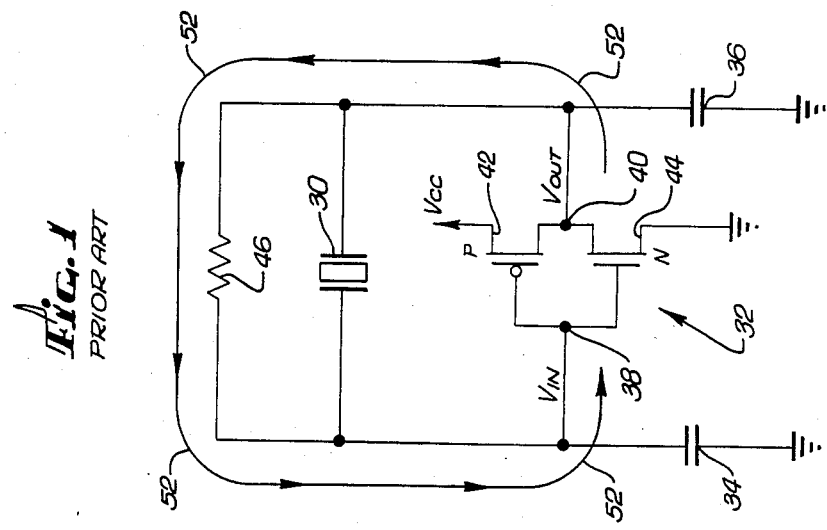
FIG. 1 is a schematic diagram of a prior art crystal oscillator circuit.

As is evident from the above description, fastest start-up times may be achieved by opening switch 76 immediately when high value gain is obtained for the inverter (when $V_{in}$ is approximately equal to $V_{out}$). This will result in high gain amplification of high level noise, resulting in fast and reliable oscillation of the crystal. It is also within the scope of the present invention, however, that the switch 76 may be opened sometime after or sometime before maximum gain is achieved by the inverter. For example, the switch 76 could be opened sometime after the elapse of time $t_1$ and still result in an improved start-up time when compared to the prior art circuits since high level noise will still be amplified by high gain. Similarly, the switch 76 could be opened before maximum gain is reached at the inverter. Although the inverter will have less than maximum gain, this gain may still be sufficient to amplify the high level noise to maximum amplitude in a time less than that required by the prior art device illustrated in FIG. 1.

Figure 7:
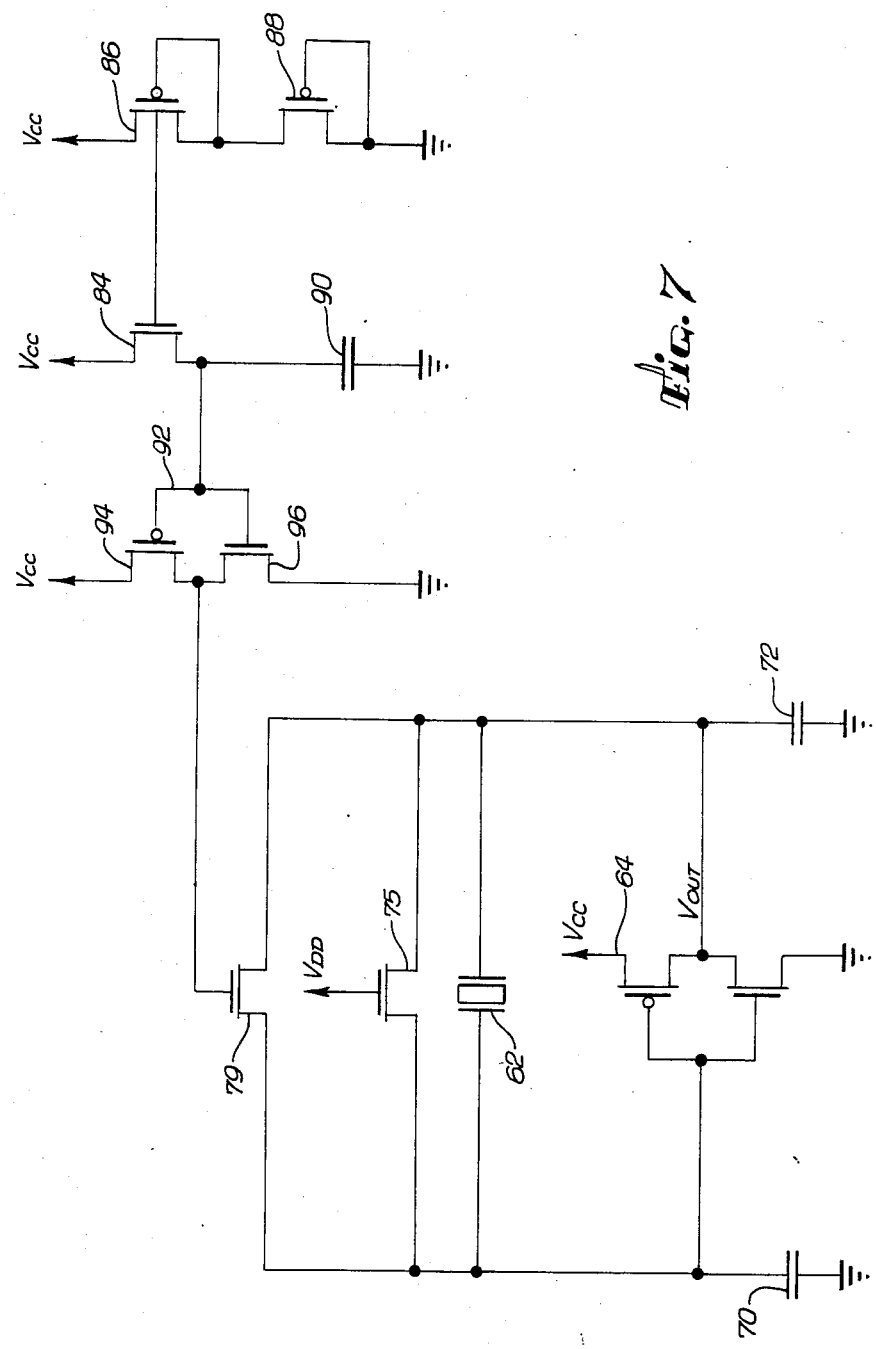
FIG. 7 is a schematic diagram of an alternate embodiment of the circuit of the present invention.

FIG. 7 illustrates a specific embodiment of the present invention in which high resistance resistor element 74 is realized with an FET 75 and the switch 76 and low resistance resistor element 78 is realized with an FET 79. The FET 75 is appropriately sized and biased (by a supply voltage $V_{DD}$) to provide the desired resistance. The FET 79 is controlled by a power-on-reset (POR) switch circuit which automatically turns FET 79 off after a predetermined amount of time elapses. The POR switch circuit contains a plurality of P-channel FET transistors 84, 86 and 88, a capacitor 90 and an inverter 92. Upon turn-on of the supply voltage $V_{cc}$, the output of inverter 92 goes high, turning on FET 79 such that FET 79 may function a low value resistor element. Simultaneously, application of the supply voltage $V_{cc}$ to transistor 84 creates a current source which is limited in value by transistors 86 and 88. The current from the current source charges capacitor 90, developing a voltage at the input of the inverter 92. As the capacitor 90 charges, the voltage at the input of the inverter 92 increases to the threshold of the inverter 92, turning on the N-channel transistor 96 and turning off the P-channel transistor 94 after time $t_1$ elapses. The FET 79 is thereby turned off, electrically disconnecting the low resistance path from the inverter 64. The time required to open the POR switch may thus be varied and/or controlled accordingly by adjusting various parameters. First, the gate length and channel width of transistor 84 may be varied in order to alter the value of the current which is generated as supply voltage $V_{cc}$ passes across it, thus varying the rate at which capacitor 90 charges and the speed at which the inverter reaches its voltage threshold. Second, the value of the capacitor 90 may be varied to increase or decrease the time required for the inverter 92 to reach its threshold voltage. Finally, the threshold voltage of the inverter 92 may be altered, thereby increasing or decreasing the voltage required to turn off the FET 79. The POR switch may therefore be modified or adapted to open when any selected value of gain is achieved by the inverter.

The invention has been described above with respect to one specific embodiment. It will be apparent to those skilled in the art, however, that various improvements may be made without departing from the scope and spirit of the invention. Accordingly, the invention is not to be limited by the specific illustrative embodiment, but only by the appended claims.

We claim:

1. A crystal oscillator circuit, comprising:
   a crystal;
   an inverter connected in parallel with the crystal, the inverter having an input, an output, and a power connection;
   a first grounded capacitor connected to the input of the inverter;
   a second grounded capacitor connected to the output of the inverter;
   a first resistance path between the input and the output of the inverter; and
   a selectively engageable second resistance path located between the input and the output of the inverter and having a resistance less than the first resistance path, the selectively engageable second resistance path allowing quick charge-up of the first and second capacitors upon application of power to the inverter.

2. A crystal oscillator circuit according to claim 1, wherein the selectively engageable second resistance path includes a MOS transistor.

3. A crystal oscillator circuit according to claim 1, including a switch in said second resistance path.

4. A crystal oscillator circuit according to claim 3, including reset means for controlling the switch to remain closed for a controlled amount of time after the application of power to the oscillator circuit and to open after the elapse of the controlled amount of time, electrically disconnecting the second resistance path from the inverter.

5. A crystal oscillator circuit, comprising:
   a crystal;
   an inverter connected in parallel with the crystal;
   a first resistance connected in parallel with the inverter;
   a second resistance connected in parallel with the inverter, the second resistance having a value of resistance less than the first resistance; and
   control means for selectively electrically disconnecting the second resistance from the inverter.

6. A crystal oscillator circuit according to claim 5, wherein the control means comprises a switch.

7. A crystal oscillator circuit according to claim 6, wherein the control means includes means for causing the switch to remain closed for a controlled amount of time and to automatically open after the elapse of the controlled amount of time, electrically disconnecting the second resistance from the inverter.

8. A crystal oscillator circuit, comprising:
   a crystal;
   an inverter connected in parallel with the crystal, the inverter having an input and an output;

a power source;

a first grounded capacitor connected to the input of the inverter;

a second grounded capacitor connected to the output of the inverter;

a first resistance path between the power source and the first grounded capacitor; and a second selectively engageable resistance path between the power source and the first grounded capacitor, the second selectively engageable resistance path having a resistance less than the resistance of the first resistance path.

* * * * *